United States Patent
Pelagalli et al.

[11] Patent Number: 6,122,702
[45] Date of Patent: Sep. 19, 2000

[54] MEMORY CELLS MATRIX FOR A SEMICONDUCTOR INTEGRATED MICROCONTROLLER

[75] Inventors: Sergio Pelagalli, Corsico; Marco Olivo, Bergamo, both of Italy

[73] Assignee: SGS-Thomson Microelectronics S.r.l., Agrate Brianza, Italy

[21] Appl. No.: 08/951,261

[22] Filed: Oct. 16, 1997

[30] Foreign Application Priority Data

Oct. 17, 1996 [EP] European Pat. Off. ............ 96830533
May 23, 1997 [EP] European Pat. Off. ............ 97830239

[51] Int. Cl.[7] .............................. G06F 12/00; G11C 11/00
[52] U.S. Cl. ................................ 711/1; 711/201; 711/100
[58] Field of Search ................................. 711/1, 100, 101, 711/170, 171, 200, 201

[56] References Cited

U.S. PATENT DOCUMENTS

| | | | |
|---|---|---|---|
| 4,037,211 | 7/1977 | Ikuta et al. | 364/200 |
| 5,396,608 | 3/1995 | Garde | 395/400 |
| 5,404,474 | 4/1995 | Crook et al. | 395/400 |
| 5,717,901 | 2/1998 | Sung et al. | 326/38 |
| 5,736,771 | 4/1998 | Huang et al. | 257/390 |
| 5,761,741 | 6/1998 | Robbins et al. | 711/212 |
| 5,812,472 | 9/1998 | Lawrence et al. | 365/201 |
| 5,835,502 | 11/1998 | Aipperspach et al. | 714/718 |
| 5,844,854 | 12/1998 | Lee | 365/230.01 |
| 5,860,076 | 1/1999 | Greene et al. | 711/1 |
| 5,862,297 | 1/1999 | Timmermans | 386/70 |
| 5,963,154 | 10/1999 | Wise et al. | 341/67 |

FOREIGN PATENT DOCUMENTS 0 501 619 A2  2/1992  European Pat. Off. ........ G06F 12/06

*Primary Examiner*—John W. Cabeca
*Assistant Examiner*—Pierre-Michel Bataille
*Attorney, Agent, or Firm*—Theodore E. Galanthay; Allen, Dyer, Doppelt, Milbrath & Gilchrist, P.A.

[57] ABSTRACT

The invention relates to a matrix of memory cells for a semiconductor integrated microcontroller. The matrix is of the type intended for accommodation between macrocells of the microcontroller so as to reduce the needed circuit area on the semiconductor. The matrix comprises memory cells which are organized into rows and columns, with the number of columns defining the matrix height. The matrix height is advantageously variable according to the number of bits intended for selecting the matrix column, while its width is dependent on the overall capacity of the memory.

10 Claims, 7 Drawing Sheets

16 TO 32 RANGE EXAMPLE

| | | | | |
|---|---|---|---|---|
| 0+42 | | | 0+42 | |
| 43 | 101011 | | 22 | 010110 |
| 44 | 101100 | | 23 | 010111 |
| 45 | 101101 | | 24 | 011000 |
| 46 | 101110 | | 25 | 011001 |
| 47 | 101111 | | 26 | 011010 |
| 48 | 110000 | C | 27 | 011011 |
| 49 | 110001 | | 28 | 011100 |
| 50 | 110010 | | 29 | 011101 |
| 51 | 110011 | | 30 | 011110 |
| 52 | 110100 | B | 31 | 011111 |
| 53 | 110101 | | 32 | 100000 |
| 54 | 110110 | | 33 | 100001 |
| 55 | 110111 | | 34 | 100010 |
| 56 | 111000 | | 35 | 100011 |
| 57 | 111001 | A | 36 | 100100 |
| 58 | 111010 | | 37 | 100101 |
| 59 | 111011 | | 38 | 100110 |
| 60 | 111100 | | 39 | 100111 |
| 61 | 111101 | | 40 | 101000 |
| 62 | 111110 | | 41 | 101001 |
| 63 | 111111 | | 42 | 101010 |

FIG. 13.

MEMORY CELLS MATRIX FOR A SEMICONDUCTOR INTEGRATED MICROCONTROLLER

FIELD OF THE INVENTION

This invention relates to a matrix of memory cells for a microcontroller integrated on a semiconductor. More specifically, the invention relates to a matrix intended for accommodation between macrocells of the microcontroller so as to reduce the consumption of semiconductor area. The matrix comprises memory cells which are organized into rows and columns, with the number of columns defining the matrix height. The invention also relates to a method for optimizing the use of circuit area in microcontroller electronic devices integrated on a semiconductor of a type including incorporating macrocells and at least one memory matrix organized into rows and columns of cells. The invention relates, particularly but not exclusively, to microcontroller electronic devices having an on-board resident memory, and the following description will make reference to such an application for convenience of illustration.

BACKGROUND OF THE INVENTION

As is well known, in a semiconductor electronic device wherein memories and macrocells are simultaneously provided, it is important to have memory matrices of a fixed size selected on the basis of the general layout of the integrated circuit or chip, and of the bulk of the macrocells in terms of silicon area. It is, therefore, important to provide sections of memory matrices which have different dimensions, so as to minimize the consumption of silicon area within the chip. FIG. 1 shows, as an example, a memory matrix 1 of conventional construction. The memory matrix 1 includes a portion 2, itself including a column multiplexer 3 for selecting a column of memory cells from a set of $2^n$ columns.

The number of columns in the memory matrix 1 is of $2^n * m$, where n is the number of column address bits, and m is the number of bits which comprise the data stored in the memory matrix 1. The number of columns that can be selected by means of the multiplexer 3 determines the height X' of the portion 2. The memory matrix 1 further includes a row decoder 4 for selecting a row from a set of rows. The size of this set of rows will vary with the number of cells comprising the memory matrix 1.

In the prior art, for selecting the column of a memory address, the address least significant memory bits (LSBs) are used, whereas to select a row, the most significant bits (MSBs) are used. In this way, a mutual correspondence is established between the address and the location in the memory cell, that is, a correspondence between the electronic datum and the topological datum. Thus, the structure of the memory matrix 1 is settled by the binary logic and the manner of addressing the memory cells in the matrix.

The use of a multiplexer 3 which can select a column from a number of columns other than 2n results in either of the following situations:

1. There would be no mutual correspondence between addresses and memory locations, that is to say some addresses would have no corresponding memory cells and which is obviously unacceptable.
2. The memory matrix 1 would have to be provided with a circuit for re-processing the addresses; however, such a circuit would be so inherently complicated as to be inconvenient to adopt, both because of its area requirements and of the delay it would introduce.

Both situations will now be evaluated in detail. As clearly shown in the diagram of FIG. 2, it is impossible to reduce the unused space representing a waste, on the chip with the dimensions currently in use for the memory cells. The memory cells are positioned in a conventional matrix arrangement with the match between the electronic data and the topological data. As previously mentioned, binary logic places considerable constraints on the matrix size.

The standard matrix addressing logic selects a column by the least significant bits of the address. The number of columns in the matrix exhausts all of the memory locations as these bits change, thereby establishing a mutual correspondence between the electronic addresses and the physical locations in the memory matrix.

For selecting a row, the most significant bits in the memory address are similarly used. Actually, the number of rows would not always match all possible combinations of row address bits. Accordingly, some bit combinations may not be decoded, and some addresses are associated with no rows in the memory matrix. This is the case where a number of rows other than a power of two is demanded. Other memories or registers are frequently configured to correspond to such addresses, or in some cases, the addresses are left unused.

A numerical example is given here below to make the point clear. For a 48-Kbyte matrix, 16-bit memory addresses must be used, enabling a total of up to 64 Kbytes to be addressed. Thus, there will be 16 Kbytes of memory addresses that correspond to no memory locations physically within the matrix Such a memory matrix may be organized as shown in FIG. 3. The least significant bits A5–A0 select one column from a total of 64 columns, while the bits A15–A6 address one row from a total of 768 rows.

As shown best in FIG. 3, all the physical memory locations of the illustrative memory matrix are disposed in a regular sequence, that is, with one memory cell of the matrix that corresponds to each memory address from 0d to 49151d. However, for a number of columns in the matrix other than $2^n$, with n being an integer, the regular situation shown in FIG. 3 would no longer be obtainable. In fact, the active memory locations of the matrix would get mixed up with non-active locations, or even worse, with locations relating to other matrices in the whole memory device. For example, with 50 columns, there would be addresses, from 50d to 63d, that fail to address a physical cell in the memory, since the addresses 0d to 49151d actually address 38400 cells only.

To use a number of cells other than $2^n$ on both sides of the memory matrix without introducing undue complication in the matrix control circuits, it could be attempted to add an input circuit for processing the incoming addresses such that one memory cell corresponds to each address. From a theoretical standpoint, the problem would be solved by the use of an input circuit adapted to execute the following algorithms:

A=address
NC=number of columns
ROW (ROW)=FLOOR (A/NC)
COLUMN (COLUMN)=A–ROW*NC

Such a circuit should contain at least a divider and an adder/subtractor, and would be disadvantageous in requiring a very large circuit area and plural clock cycles. The last-mentioned factor adversely affects memory access time. Actually, given any number of columns, such an input processing circuit would be quite a complex in that it involves all of the address bits. Such an input processing circuit should be a second memory matrix being input addresses to be processed and outputting "processed" addresses.

To simplify the input circuit, it could be assumed to introduce an adder therein to add a constant value to each address In practice, this value would be dependent on the address itself, thereby making the input circuit even more complicated.

It could be also attempted to perform a 90-degree rotation of the memory matrix so as to have the roles of the x and y coordinates of the memory addresses exchanged, but this would not provide a satisfactory solution to the problem. As shown in FIG. 4, the number of columns still has to be a power of 2, which means that the implementable memories would be no more than 4 or 5, i.e. those corresponding to 16, 32, 64, 128 and 256 columns.

Thus, not even this solution is an acceptable one where matrices are to be a size as close as possible to that demanded by the user. The height X' of the section 2 of conventional memory matrices is, therefore, set at a value of $2^n$. However, the insertion of the memory matrix 1 in a chip leaves some unused areas. Hence, this results in a need to act on this fixed size of the memory matrix 1 for adapting it to the neighboring macrocells within the chip.

SUMMARY OF THE INVENTION

In view of the foregoing background, it is therefore an object of the invention to provide a memory matrix, particularly, for positioning adjacent macrocells of a microcontroller that reduces the needed area, and which permits relatively straightforward addressing of the memory cells.

This and other objects, features and advantages in accordance with the present invention are provided by a memory including a matrix of memory cells organized into rows and columns, and wherein the number of columns define the matrix height and the height is variable and is determined according to a number of memory address bits intended for selecting the row and column of the matrix. The width of the matrix is dependent on an overall desired capacity of the memory. For example, the height may be between about thirty-two to sixty four, and, more preferably forty-three for some embodiments.

The memory preferably further comprises a column decoder and a row decoder. Accordingly, the selection of a memory location column is derived from a predetermined number of least significant bits of the memory address, while the selection of a row is derived from the remaining most significant bits of the same memory address.

In addition, a predetermined number of memory addresses may define residuaries having no corresponding locations in the memory and are used as additional rows. A pre-decode circuit may be provided to act on the memory addresses to check whether the codes of the predetermined number of bits relate to memory locations which belong to the residuaries. In accordance with a method aspect of the invention, the pre-decoding step may be carried out on the memory addresses to check whether the codes of the predetermined number of bits relate to memory locations which belong to the set of residuaries, in conformity with the following rules:

if the value of the least significant bit in the residuary row is 0, then the address relates to "even" rows and the bits of the predetermined number of bits undergo conversion by a complementation operation; and if the value of the least significant bit in the residuary row is 1, then the address relates to "odd" rows, and the bits of the predetermined number of bits undergo conversion by a translation operation.

BRIEF DESCRIPTION OF THE DRAWINGS

The features and advantages of the matrix and method of this invention will be apparent from the following description of an embodiment thereof, given by way of illustration and not of limitation with reference to the accompanying drawings.

FIG. 13 shows schematically an application table illustrating the method of this invention.

DETAILED DESCRIPTION OF THE PREFERRED EMBODIMENTS

Figure 1:
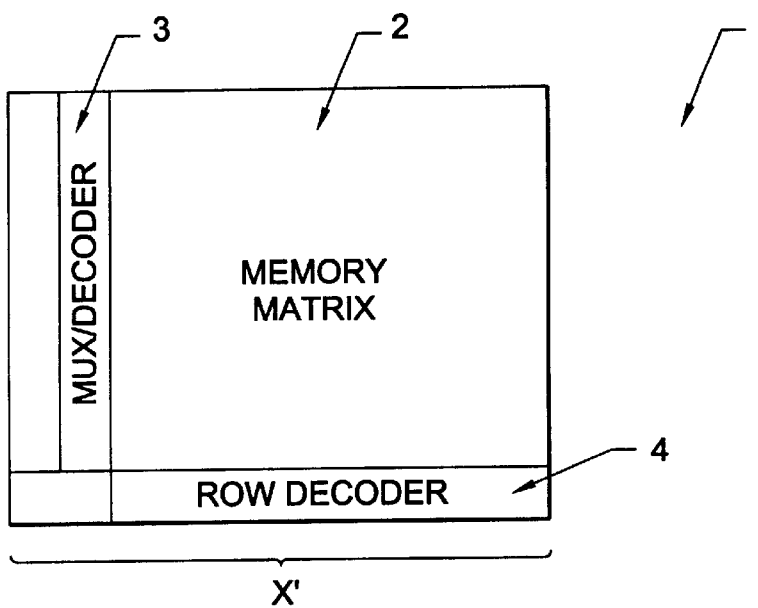
FIG. 1 shows schematically a conventional matrix of memory cells for incorporation in an electronic device integrated on a semiconductor as in the prior art.
Figure 2:
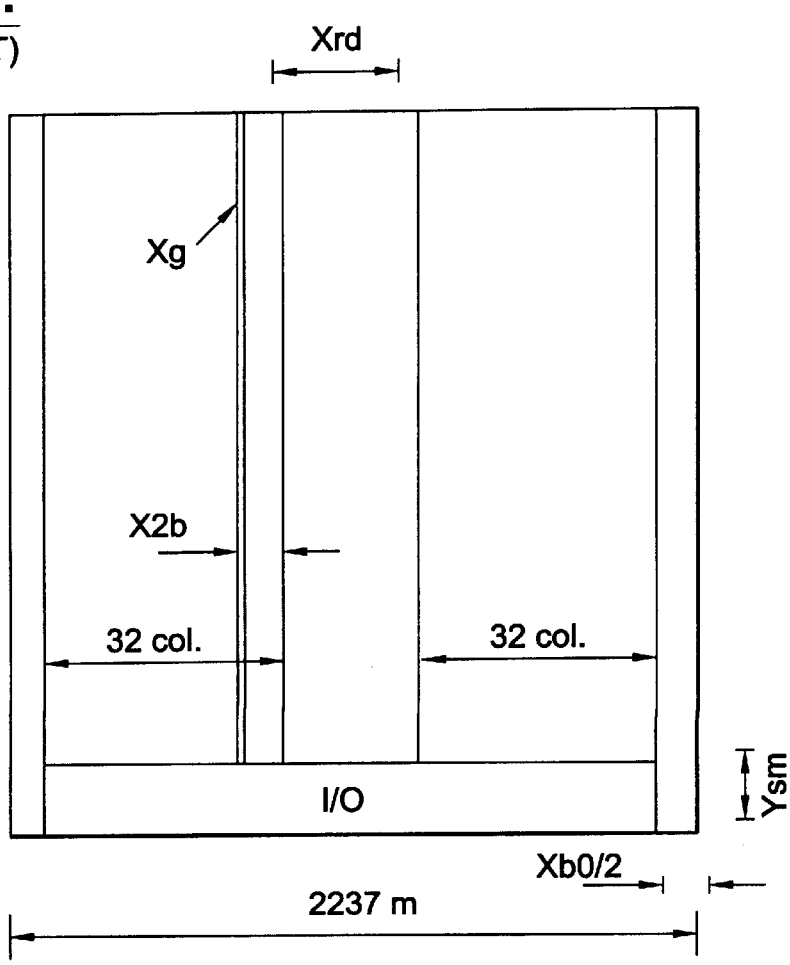
FIG. 2 shows the prior art matrix of FIG. 1 in greater detail.
Figure 3:
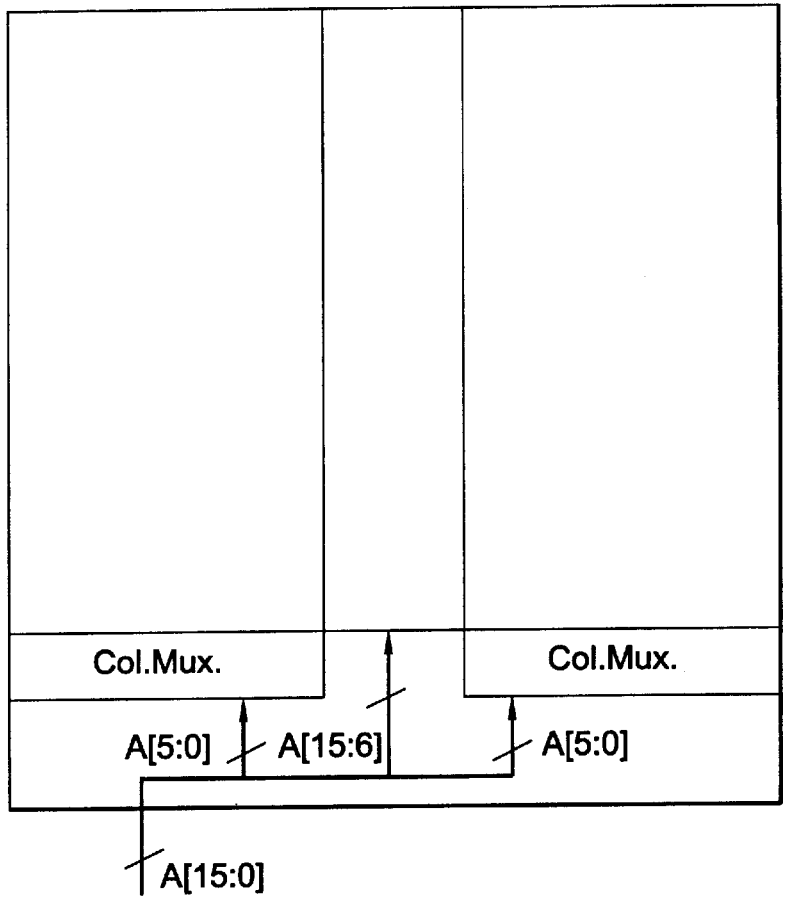
FIGS. 3 and 4 are further schematic views of the prior art matrix shown in FIG. 1.
Figure 4:
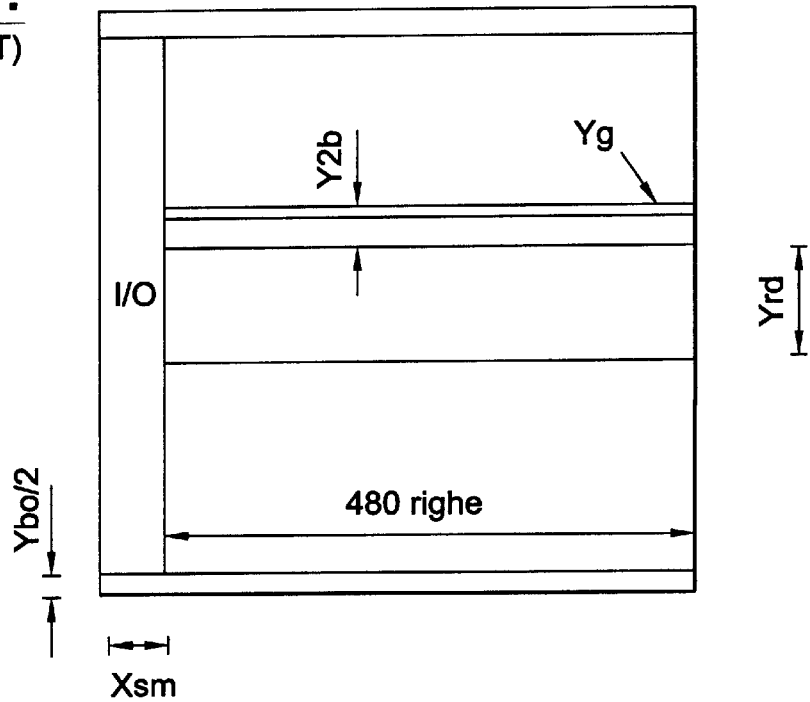
Figure 5:
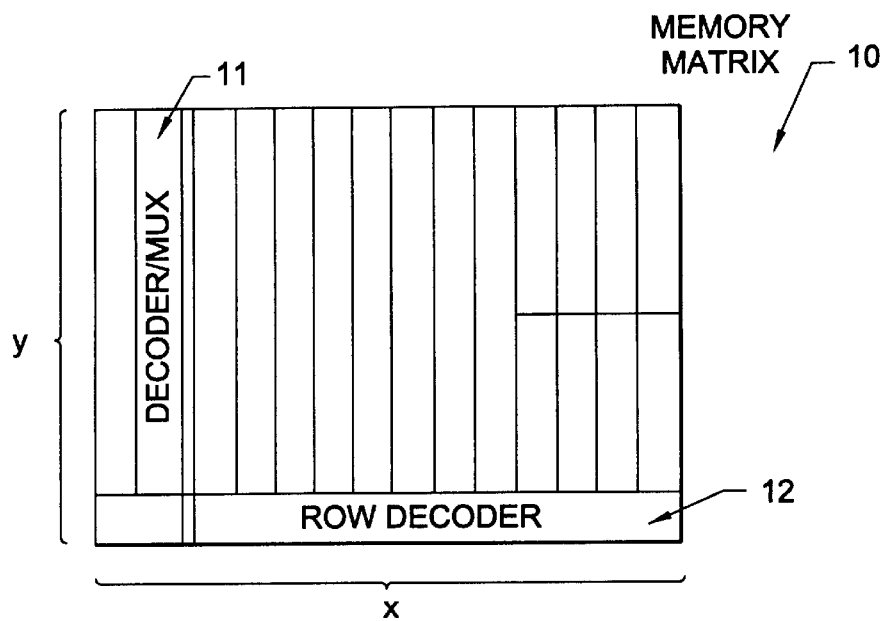
FIG. 5 shows schematically a memory matrix according to the invention.

Referring to the drawing views, and particularly to FIG. 5, generally shown at 10 is a memory matrix according to the invention and intended for incorporation into a semiconductor integrated electronic device. The device 1 may be, for example, a microcontroller or a microprocessor having resident (on-board) macrocells and memory, although this device may be an integrated memory circuit. In the embodiment being described by way of example, the matrix incorporated into the microcontroller is of the ROM type and comprises memory words of sixteen bits.

The memory matrix 10 includes a multiplexer or decoder 11 for selecting a column in the matrix, and a similar row decoder 12 for selecting a matrix row. For simplicity, it will be assumed hereinafter that the number m of bits making up the data stored in the memory matrix 10 is one, the considerations made herein below also applying, however, to any internal value of m greater than one.

In addition, a prior solution for providing a height X of the memory matrix 10 in the 32 to 64 range will be described first for the sake of clarity. In particular, the memory matrix 10 in FIG. 5 has a height X equal to 43 memory cells. To select a column, the six least significant bits (A5–A0) of the memory address are used which, accordingly, allow 64 columns to be selected. In this way, if a height X of 43 columns is provided, there remain twenty-one addresses which have no corresponding memory locations, these addresses being referred to hereinafter as "residuaries". The matrix height is determined by the number X of columns, and the matrix width is given by a variable Y which is dependent on the overall capacity of the memory. Each row pair has, therefore, 42 residuaries which have no corresponding physical locations in the memory matrix 10, that is, there will be one row of residuaries for every two memory rows.

Indicating with CM the capacity of the memory matrix 10, the number of rows of the memory matrix 10 can be readily found by the following formula:

$$NR=(CM/64)*3/2 \quad (1)$$

The first CM/64 rows have, therefore, a row decoding which makes use of the ten remaining bits (A15–A6) of the memory address. The remaining CM/(64*2) rows have a row decoding that only uses the nine most significant bits (A15–A7).

The residuary rows comprise memory cells that correspond to the following addresses:

A15 A14 A13 A12 A11 A10 A9 A8 A7 A6 A5 A4 A3 A2 A1 A0

X X X X X X X X X 0 1 0 1 0 1 1 up to

X X X X X X X X X 0 1 1 1 1 1 1 and

X X X X X X X X X 1 1 0 1 0 1 1 up to

X X X X X X X X X 1 1 1 1 1

The number of data that is stored into the residuary rows is 42, a single cell of such special rows being left unused. This is a small waste in view of the actual dimensions of the memory matrix 10.

For providing a semiconductor integrated electronic device which incorporates a memory matrix organized to include residuaries as just described, the row/column pre-decode and decode circuits should first be adjusted for the new matrix layout of the memory cells. Then, the memory matrix 10 should be provided with an input circuit to perform the following functions.

1. Recognize if (A5–A0)>42d or if (A5–A0)<42d:
   1.1 if (A5–A0)<42d activate the ordinary row,
   1.2 if (A5–A0)>42d activate the residuary row.
2. If the residuary row is activated, then:
   2.1 if A6=0 execute the complement of A5–A0,
   2.2 if A6=1 thus convert A5–A0=43–63 to A5–A0= 20–42.

Figure 6:
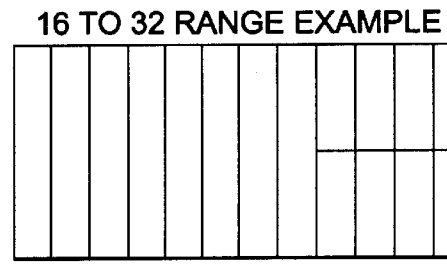
FIGS. 6 to 8 are respective schematic views of modified embodiments of the matrix shown in FIG. 5.
Figure 7:
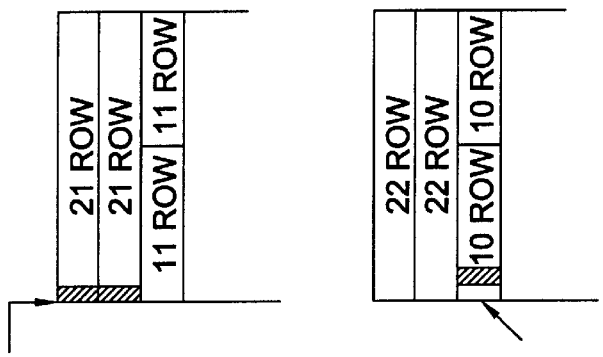

Advantageously in this invention, the height X of the memory matrix 10 can be varied by changing the number of bits intended for memory row/column selection. In particular, to provide a height X of the memory matrix 10 in the 16 to 32 range, as shown in FIG. 6, 21 or 22 bits must be used for selecting rows and columns in the matrix. In this case, the number of unused memory cells is twice as large as that of the approach previously described in relation to FIG. 5. The situation is similar when a height X in the 64 to 128 range is to be provided using 85 or 86 bits, as shown in FIG. 7.

Figure 8:
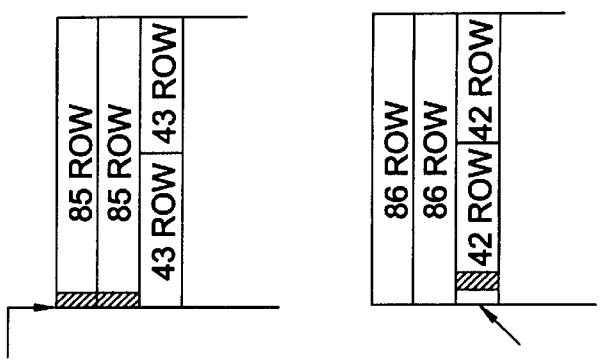

Advantageously in this invention, the number of macro-cells can be increased according to the number of columns sought, as shown in FIG. 8. Of course, the range of possible cases is a finite one, although satisfactory for most applications, and is in particular limited to heights of 16, 21, 22, 32, 43, 5 64, 85, 86 and 128 columns.

Where a number of columns of $2^n$ to $2^{(n+1)}$ is to be provided, a minimum of wasted memory cells in the residuary row will be obtained with a number of columns as given by:

NCmin=FLOOR($2^{(n+2)}/3$)+1 for any of n>3.

However, one could choose different values from the above, if an increased number of unused cells within the residuary row is acceptable. For example, with N=5, the minimum number NCmin of columns in the residuary row would vary between $2^5$=32 to $2^6$=64, and would be selected equal to 43.

If NC is selected equal to 44, there will be four unused cells out of 128. When NC=45 is selected, there will be 7 unused cells out of 128; and selecting NC=46 will leave 10 unused cells out of 128.

Furthermore, the number of ordinary rows and the number of residuary rows may be grouped differently, the rule to be used in this case being that: the residuary row should contain the "residuaries" from a number of ordinary rows equal to $2^k$, where k is an integer. Should the number of ordinary rows be other than $2^k$, then the row decode circuit is just too complicated and involves the column address bits as well. Increasing the value of the parameter k usually makes the column decoding structure complicated, and leads to more row bits getting involved in column selection.

Figure 9:
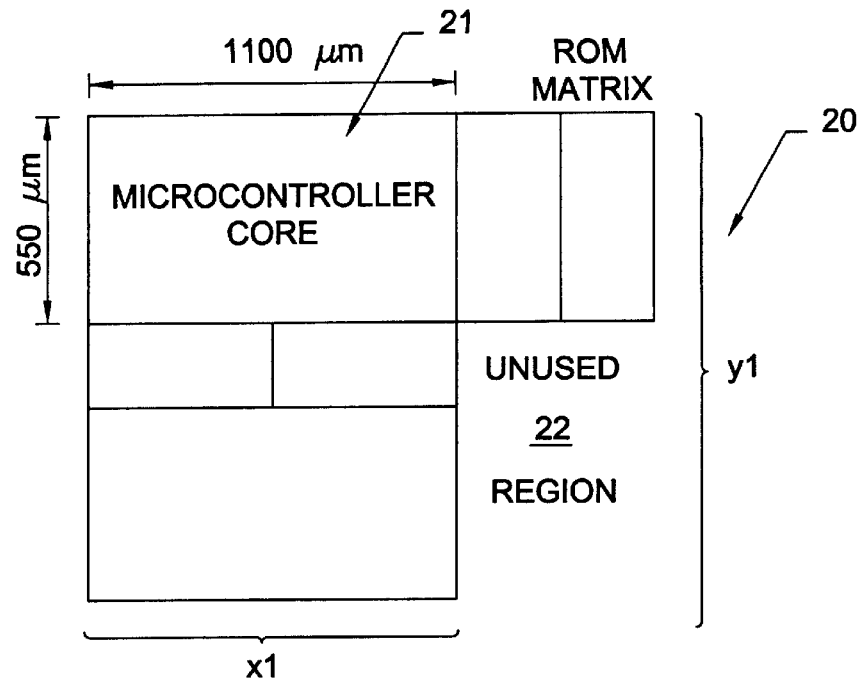
FIG. 9 is a schematic view of a microcontroller electronic device integrated on a semiconductor and incorporating a memory matrix according to the invention.

Reference will now be made to a microcontroller which is available commercially as ST7 new from the assignee of the present invention and can advantageously be arranged to include the matrix organization of this invention. The ROM matrix 20 of the ST7 microcontroller, as shown in FIG. 9, has been thoroughly re-designed to make it more suitable for the dimensions of the other macrocells incorporated in the device. In particular, one dimension of the matrix 20, hereinafter denoted by x1, must not exceed 1680 µm, so as to fit the size of the microcontroller core 21. The dimensions of the ROM matrix 20 is currently 2230 µm. Accordingly, an unused region 22 approximately 450 µm wide and having the same length as the matrix is created as shown in FIG. 9.

Figure 10:
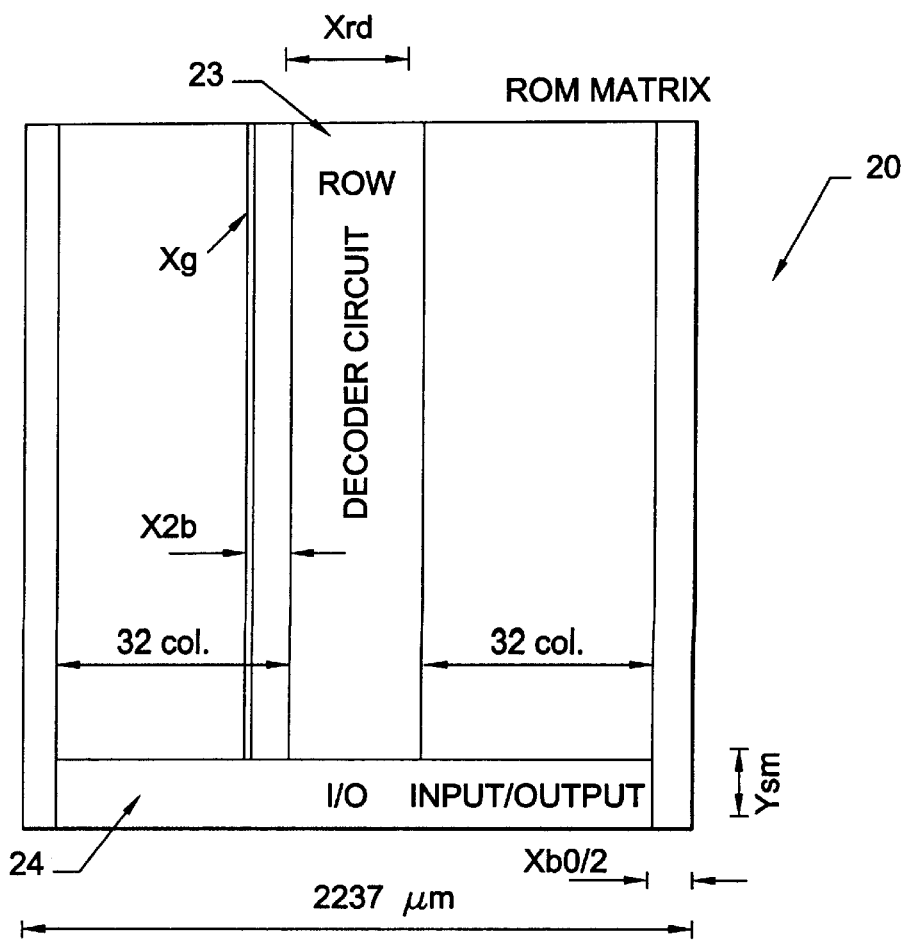
FIG. 10 shows the matrix of the microcontroller of FIG. 9 in further detail.

The other dimension, hereinafter denoted by y1, of the ROM matrix is variable because it is determined by the total number of bytes, and hence the number of memory cells, wanted by the user. The ROM matrix 20 includes, as shown best in FIG. 10, a row decoder circuit 23 located centrally on the matrix.

In particular, the dimensions of the components of the matrix 20 are as follows:

horizontal dimension of a memory cell: Xc=3.1 µm;

vertical dimension of the memory cell: Yc=3.0 µm;

width of ground lines within the matrix 20: XG=4 µm;

width of 16 cells and one ground line (there being one ground line provided for every 16 memory columns): X2b=3.1*16+4=53.6 µm;

width of new row decode circuit: Xrd=422 µm;

width of matrix power supply edges: XbO=100 µm;

width of column multiplexers and input/output circuits: Ysm=240 µm; the latter dimension being an estimated value.

The number of columns in the matrix 20 will be indicated as NC hereinafter, and its row number as NR. Also, a memory matrix of no more than 64 Kbytes will be considered for simplicity. Each memory address is, therefore, made up of 16 bits, denoted by A15–A0 as before.

The memory matrix of this invention must have a number of columns within the range of 32 to 64. In fact, for 32 columns, it is:

$$x1=NC/2*X_{2b}+X_{rd}+X_{bO}=1379.6 \text{ µm}$$

while for 64 columns, it is:

$$x1=NC/2*X_{2b}+X_{rd}+X_{bO}=2237.2 \text{ µm}$$

and the x1 dimension of the memory matrix that has been implemented in the instance of microcontroller ST7 is 1680 µm.

The optimum choice is here a matrix with 43 columns, whereby:

$$x1=NC/2*X_{2b}+X_{rd}+X_{bO}=1701.2 \text{ µm}.$$

Of course, there is an increase in the X1 height due to the memory cells being rearranged within the matrix. This increase is not a problem because the number of rows is bound to vary anyhow with the memory capacity. In addition, the reduction in the matrix width involved a change in the layout of the input/output circuit portion I/O, denoted by 24 in FIG. 10. This situation results in a further increase of the y1 dimension of the matrix.

Figure 11:
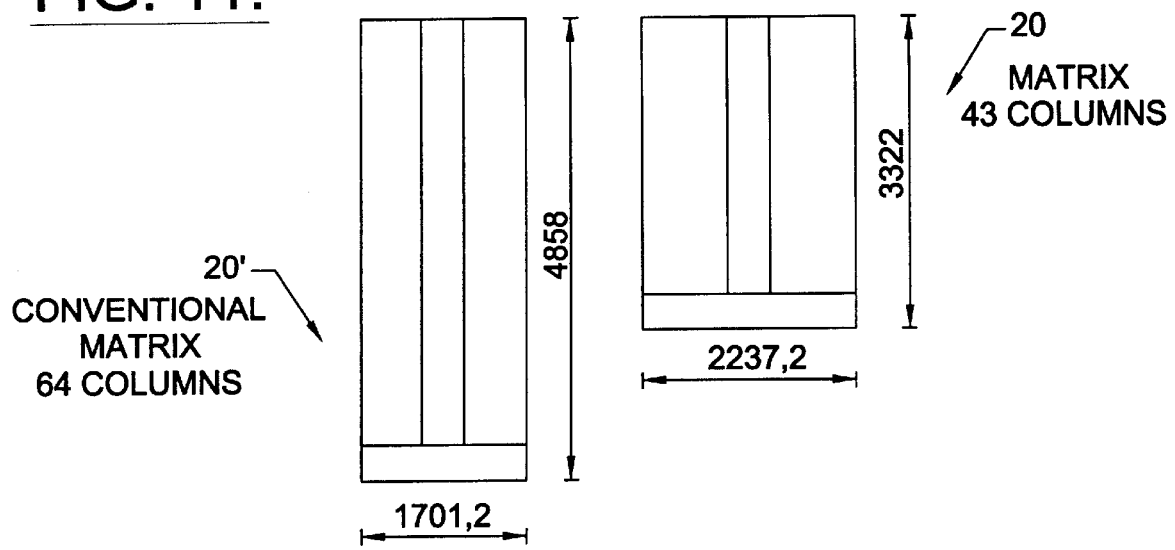
FIGS. 11 and 12 are schematic comparative views of memory matrices according to the prior art and this invention, respectively.

A numerical example, relating to a 64 kbyte memory, is given herein for clearer illustration. Shown and compared in FIG. 11 are a conventional matrix 20' with 64 columns and a matrix 20 according to the invention having 43 columns.

The method for optimizing the circuit surface area of the electronic semiconductor device incorporating the memory matrix 20 of this invention will now be described. The memory address includes 16 bits, the least significant six of which select a column, and the most significant ten of which select a row.

Thus, assuming that the entire contents of the memory are read, starting with the lowest memory location (0d) and proceeding toward higher address values, the first 43 memory locations relate to the cells forming the first row, which comprises 43 cells, in fact. The 21 memory locations left to complete the first row have been referred to as residuaries, and at this stage of the description, correspond to no physical memory cell.

Upon reaching the sixty-fourth memory location, i.e. at the address A5–A0=63d, the seventh bit of that address, i.e. bit A6 or the least significant bit in the row, will change from 0 to 1 and select the second matrix row. Similarly to the first row, the first 43 memory locations, i.e. the addresses included between 64d and 106d, correspond to memory cells in the second matrix row, while the memory locations relating to the addresses 107d to 127d become residuaries.

Figure 12:
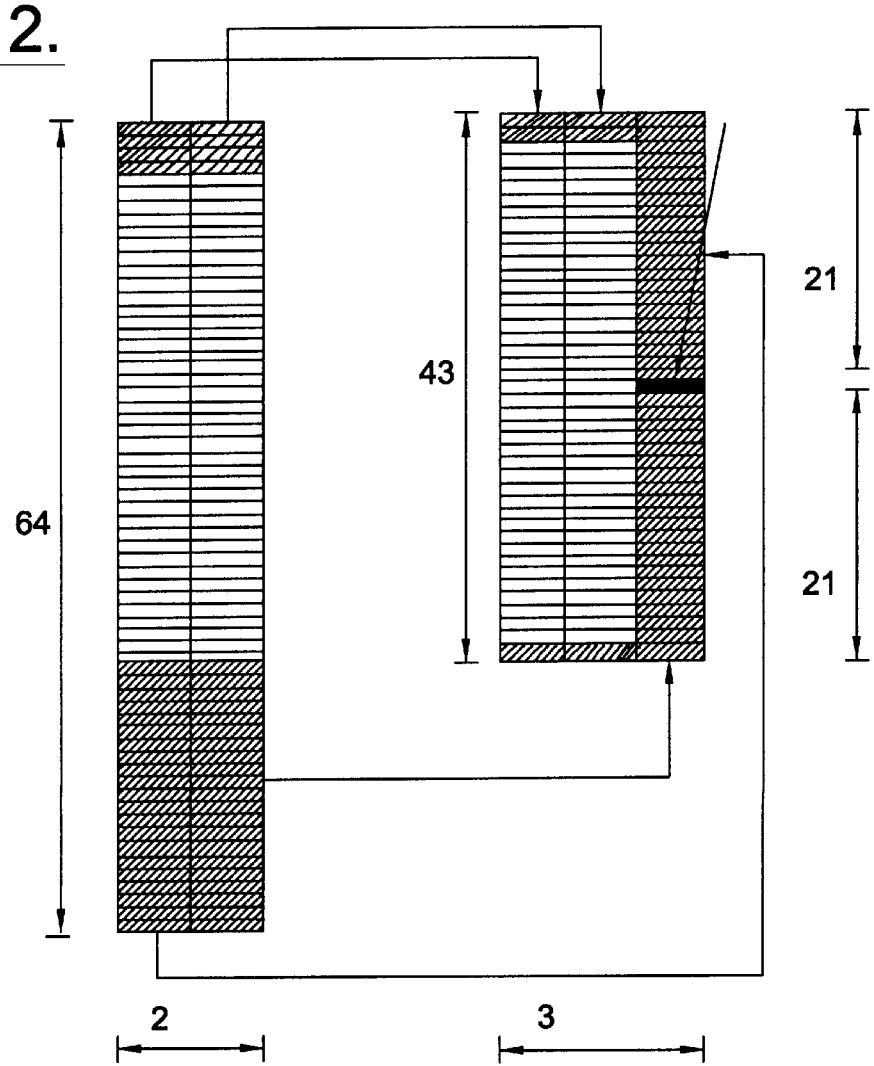

At this point, the set of residuaries will be comprised of 42 electronic addresses which have no corresponding physical memory cells. The third row of matrix cells is then devoted to the residuaries. This row of residuaries is fully utilized, and only one memory cell remains unused, while being physically present in the row. Thus, there will be a series of two ordinary rows and one residuary row. This arrangement is repeated until all the memory locations and the addressing space are exhausted, as shown in FIG. 12.

Advantageously in this invention, the organization of the memory matrix 20 uses binary logic and is, therefore, relatively simple. The structure described above is reiterated at every 128, or 27, bytes. In this way, providing circuits which allow the addresses to be suitably modified becomes a very simple matter.

Figure 14:
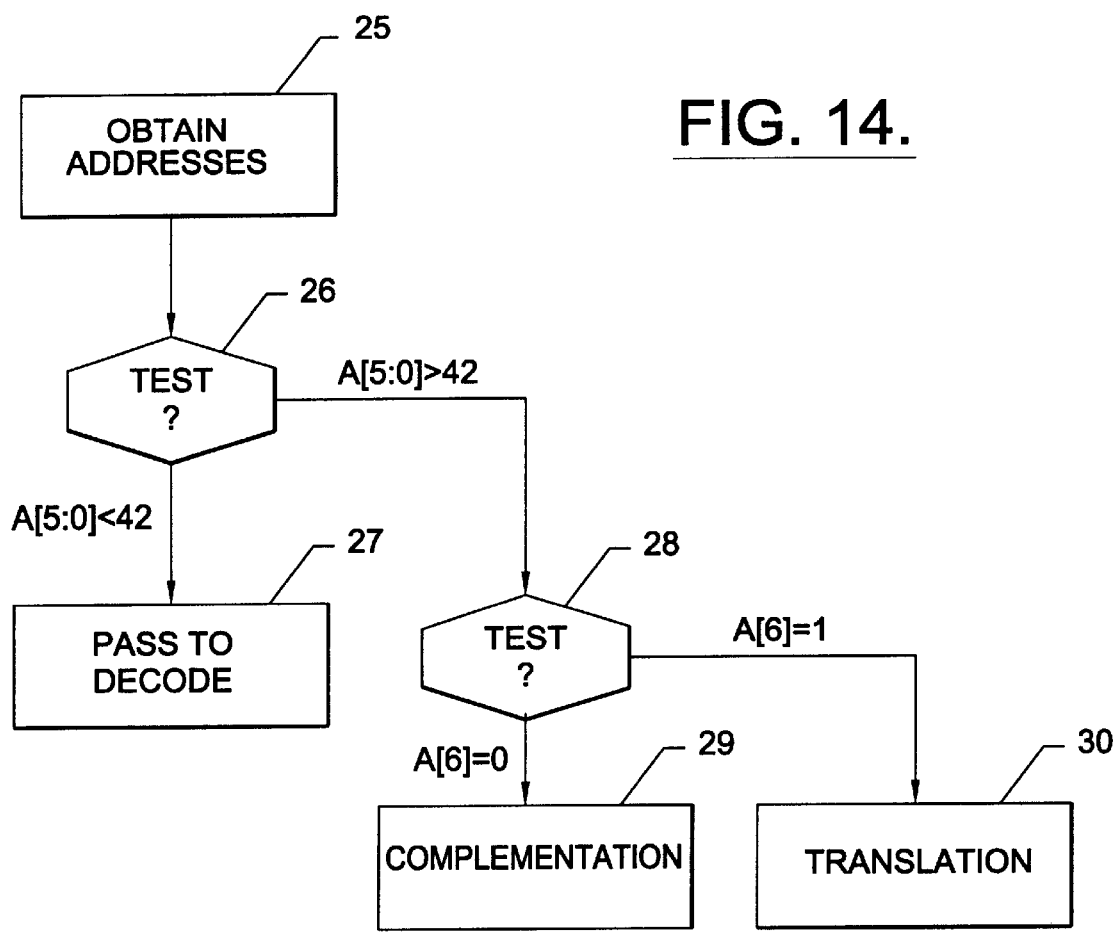
FIG. 14 is a schematic view of a flow chart according to the method of this invention.

The placement of residuaries in their dedicated row follows a few simple rules. FIG. 14 schematically illustrates these rules in flow chart form. Because of the matrix structure, the addresses 25 are divided into two broad categories, identified during a test step 26, namely:

addresses with A5–A0<42d, and
addresses with A5–A0>42d.

In fact, for A5–A0<42d, the address 25 is to undergo no treatment, and is passed on to the memory decode circuits represented schematically by the block 27, which corresponds to no action being taken with A5–A0.

On the other hand, for A5–A0>42d, the address relates to memory locations which belong to the set of residuaries, and therefore, is to be modified through a test block 28 which checks A6=1 for truth, in conformity with the following rules:

1. If A6, i.e. the least significant bit in the residuary row, is 0, the address relates to "even" rows and the bits A5–A0 must be changed to become the addresses 0 to 20 by a simple complementation operation carried out in the block 29 to produce the complement of A5–A0.

2. If A6 is 1, the address relates to "odd" rows, and the bits A5–A0 must be changed in a translation step represented schematically by the block 30 so as to be turned into the addresses 22 to 42, according to the table shown in FIG. 13.

The changes undergone by the residuary bits show certain simplifications. In particular, the least significant four bits are nearly always kept the same, or converted by an elementary operation (item C in FIG. 13). Advantageously in this invention, no constraint is placed on the succession of ordinary and residuary rows. For example, in the ROM matrix incorporated to the microcontroller, a layout of groups comprised of sixteen ordinary rows and eight residuary rows was chosen.

The application described in the foregoing involves an increase in the memory dimensions tied to the increase of rows in the matrix up to the capacity of interest. The same considerations would apply where the roles of the rows and columns are exchanged. In this case, the memory capacity would be increased by adding columns instead of rows.

What is claimed is:

1. A memory to be accommodated among macrocells of a microcontroller so as to reduce needed circuit area, said memory comprising:

a matrix of memory cells organized into rows and columns, the number of columns defining the matrix height and the height being variable determined according to a number of memory address bits intended for selecting the row and column of the matrix, the width of the matrix being dependent on an overall desired capacity of the memory;

a column decoder and a row decoder;

wherein the selection of a memory column location is derived from a predetermined number of least significant bits of the memory address, while the selection of a row is derived from the remaining most significant bits of the same memory address with a predetermined number of memory addresses defining residuaries having no corresponding locations in the memory and are used as additional rows; and a pre-decode circuit acting on the memory addresses to check whether the codes of said predetermined number of bits relate to memory locations which belong to the residuaries.

2. A memory according to claim 1, wherein the height is between about thirty-two to sixty-four.

3. A memory according to claim 2, wherein the height is forty-three.

4. A microcontroller comprising:

a plurality of macrocells;

at least one memory positioned adjacent said macrocells, said at least one memory comprising a matrix of memory cells organized into rows and columns, the number of one of the rows or columns defining a first matrix dimension and the first matrix dimension being determined according to a number of memory address bits intended for selecting the row and column of the matrix, second matrix dimension being dependent on an overall desired capacity of the memory;

a column decoder and a row decoder;

wherein the selection of a memory column location is derived from a predetermined number of least significant bits of the memory address, while the selection of a row is derived from the remaining most significant bits of the same memory address with a predetermined number of memory addresses defining residuaries having no corresponding locations in the memory and are used as additional rows; and a pre-decode circuit acting on the memory addresses to check whether the codes of said predetermined number of bits relate to memory locations which belong to the residuaries.

5. A microcontroller according to claim 4, wherein the first matrix dimension is between about thirty-two to sixty-four.

6. A microcontroller according to claim 5, wherein the first matrix dimension is forty-three.

7. A memory comprising:

a matrix of memory cells organized into rows and columns, the number of one of the columns or rows defining a first matrix dimension and the first matrix dimension being determined according to a number of memory address bit intended for selecting the row and column of the matrix, a second matrix dimension being dependent on an overall desired capacity of the memory, the first matrix dimension being between about thirty-two to sixty-four;

a column decoder and a row decoder;

wherein the selection of a memory column location is derived from a predetermined number of least significant bits of the memory address, while the selection of a row derived from the remaining most significant bits of the same memory address with a predetermined number of addresses defining residuaries have no corresponding locations in the memory and are used as additional rows; and a pre-decode circuit acting on the memory addresses to check whether the codes of said predetermined number of bits relate to memory locations which belong to the residuaries.

8. A memory according to claim 7, wherein the first matrix dimension is forty-three.

9. A method for reducing the occupation of circuit area in a microcontroller electronic device integrated on a semiconductor and incorporating macrocells and at least one memory, the method comprising the steps of:

positioning the at least one memory adjacent the macrocells, the memory including a plurality of cells;

organizing the plurality of cells into rows and columns and with the number of one of the rows or columns defining a first matrix dimension;

determining the first matrix dimension according to a number of memory address bits intended for selecting the row and column of the matrix, and determining a second matrix dimension dependent on an overall desired capacity of the memory with selection of a memory column location is derived from a predetermined number of least significant bits of the memory address, while the selection of a row is derived from the remaining most significant bits of the same memory address, and so that a predetermined number of addresses, referred to as the residuaries and having no corresponding locations in the memory, are utilized as additional matrix rows; and checking through a pre-decode circuit that acts on the memory addresses whether the codes of the predetermined number of bits relate to memory locations which belong to the residuaries.

10. A method according to claim 9, wherein the step of checking is in conformity with the following rules:

if the value of the least significant bit in the residuary row is 0, then the address relates to "even" rows and the bits of the predetermined number of bits undergo conversion by a complementation operation; and if the value of the least significant bit is the residuary row is 1, then the address relates to "odd" rows, and the bits of the predetermined number of bits undergo conversion by a translation operation.

* * * * *

UNITED STATES PATENT AND TRADEMARK OFFICE
CERTIFICATE OF CORRECTION

PATENT NO. : 6,122,702
DATED : September 19, 2000
INVENTOR(S) : Pelagalli et al.

It is certified that error appears in the above-identified patent and that said Letters Patent is hereby corrected as shown below:

Item [54] Title
and
Col. 1, lines 1-3

Delete:
"MEMORY CELL MATRIX FOR A SEMICONDUCTOR INTEGRATED MICROCONTROLLER"

Substitute:
-- MEMORY WITH VARIABLE MATRIX CELLS FOR A SEMICONDUCTOR INTEGRATED MICROCONTROLLER"

Signed and Sealed this

Twenty-fourth Day of April, 2001

Attest:

NICHOLAS P. GODICI

*Attesting Officer*　　　*Acting Director of the United States Patent and Trademark Office*